United States Patent
Ogure et al.

(10) Patent No.: US 6,573,201 B1
(45) Date of Patent: Jun. 3, 2003

(54) METHOD AND APPARATUS FOR PROTECTION OF SUBSTRATE SURFACE

(75) Inventors: Naoaki Ogure, Tokyo (JP); Hiroaki Inoue, Tokyo (JP)

(73) Assignee: Ebara Corporation, Tokyo (JP)

( * ) Notice: Subject to any disclaimer, the term of this patent is extended or adjusted under 35 U.S.C. 154(b) by 0 days.

(21) Appl. No.: 09/332,904

(22) Filed: Jun. 15, 1999

(30) Foreign Application Priority Data

Jun. 17, 1998 (JP) .............................. 10-169463

(51) Int. Cl.[7] .................................. H01L 21/68
(52) U.S. Cl. .................. 438/908; 29/25.01; 118/50; 118/724
(58) Field of Search ............... 29/25.01; 118/50; 118/724; 438/908

(56) References Cited

U.S. PATENT DOCUMENTS

| | | | |
|---|---|---|---|
| 3,918,267 A | * | 11/1975 | Canter |
| 3,977,851 A | * | 8/1976 | Toya |
| 4,281,031 A | * | 7/1981 | Hillman et al. |
| 4,430,150 A | * | 2/1984 | Levine et al. |
| 4,534,312 A | * | 8/1985 | Shinya et al. |
| 4,883,775 A | * | 11/1989 | Kobayashi |
| 4,951,601 A | * | 8/1990 | Maydan et al. |
| 5,378,284 A | * | 1/1995 | Geisler et al. |
| 5,976,198 A | * | 11/1999 | Suhara et al. |
| 6,063,697 A | * | 5/2000 | Wolf et al. |
| 6,079,354 A | * | 6/2000 | Guo et al. |
| 6,093,091 A | * | 7/2000 | Keller |
| 6,110,011 A | * | 8/2000 | Somekh et al. |
| 6,132,289 A | * | 10/2000 | Labunsky et al. |
| 6,134,907 A | * | 10/2000 | Mueller et al. |

* cited by examiner

Primary Examiner—Olik Chaudhuri
Assistant Examiner—Joannie Adelle Garcia
(74) Attorney, Agent, or Firm—Wenderoth, Lind & Ponack, L.L.P.

(57) ABSTRACT

A method and apparatus can provide surface protection of substrates such as semiconductor wafers while they are being transported from one unit process to another unit process. The method comprises coating at least a part of a surface of the substrate with a coagulated film such as an ice film.

4 Claims, 6 Drawing Sheets

FIG. 4

| gas \ temperature Variable | Initial adhesion coefficient | | Molecular adsorption density (cm$^{-2}$) | |
| --- | --- | --- | --- | --- |
| | 27°C | -195°C | 27°C | -195°C |
| $H_2O$ | 0.5 | — | $30 \times 10^{15}$ | — |
| CO | 0.7 | 0.95 | $5\sim23 \times 10^{15}$ | $50\sim160 \times 10^{15}$ |
| $N_2$ | 0.3 | 0.7 | $0.3\sim12 \times 10^{15}$ | $3\sim60 \times 10^{15}$ |
| $O_2$ | 0.8 | 1.0 | $24 \times 10^{15}$ | — |
| $CO_2$ | 0.5 | — | $4\sim24 \times 10^{15}$ | — |

METHOD AND APPARATUS FOR PROTECTION OF SUBSTRATE SURFACE

BACKGROUND OF THE INVENTION

1. Field of the Invention

The present invention relates to a method and an apparatus for preventing surface contamination and degradation of a device surface of a substrate while it is being transferred from one processing unit to another processing unit in a semiconductor device manufacturing line.

2. Description of the Related Art

Circuit integration density for semiconductor devices has been remarkably increasing in recent years, and thickness of a layer deposited on or etched from the substrate in a single unit process has become much smaller. In manufacturing such multilayered devices, it is necessary to repeatedly apply deposition and etching treatments in individual processing operations. As the number of such operations increases, there is a corresponding increase in the potential for contaminating the processed surface by particles and molecules, resulting from exposure to unfavorable environments or degradation due to chemical interaction.

For example, when a pure silicon surface is exposed to an air atmosphere even for a few seconds at room temperature, the surface becomes coated with a natural oxide (of thickness of about 50 Å) which causes surface degradation or changes in the surface character, and furthermore, adsorption (molecular contamination) of various gaseous species in the air such as $N_2$, $O_2$, $CO_2$, etc. can occur on the outermost surface, as well as adhesion of particulates such as organic matters, oxides, metals, ions, etc. floating in the air to cause particulate contamination on the device surface. Such degradation and changes in the substrate surface characteristics and molecular/particulate contamination on the device surface will adversely affect the subsequent processes, and are considered to be the primary cause of performance problems in the finished devices.

SUMMARY OF THE INVENTION

It is an object of the present invention to provide a method and apparatus for providing surface protection of substrates such as semiconductor wafers while they are being transported from one unit process to another unit process, by preventing their exposure to unfavorable environments that may cause surface contamination and degradation.

The object has been achieved in a method for protecting a substrate comprising: coating at least a part of a surface of the substrate with a coagulated film. The method may be conducted in a semiconductor device manufacturing line that repeatedly performs a plurality of stepwise processes of forming film layers, etching and removing portions of film layers wherein as-processed surface conditions are exposed to an atmosphere that may contaminate and degrade the device surface.

Another aspect of the invention comprises: coating at least a part of a surface of the substrate with a coagulated film, and transporting the coated substrate to a processing apparatus for conducting a subsequent step.

The subsequent step may be a wet-process step or a dry-process step, or a storage process, etc. The coagulated film may be comprised by an ice film, and the ice film may be produced with a deionized or ultrapure water. The substrate may be a semiconductor wafer or a liquid crystal substrate. The substrate may be preferably coated without exposing the surface to an environmental atmosphere. The substrate may be coated by coagulating liquid film formed on the surface which is formed in a dike formed on the surface. The substrate may be coated by coagulating vapor surrounding the surface.

Another aspect of the invention is an apparatus for processing a substrate comprising: a coating apparatus for coating at least a part of a surface of the substrate with a coagulated film, a processing apparatus for conducting a processing step on the substrate, and a transporting apparatus for transporting the substrate to the processing apparatus.

Therefore, the present method of coating protection ensures that the surface conditions of processed or to-be-processed substrates are preserved while they are waiting to be processed in the next unit processing line, thereby preventing and controlling degradation and contamination of surfaces which may be caused by exposure to a processing room atmosphere.

BRIEF DESCRIPTION OF THE DRAWINGS

FIG. 4 is a table showing the adhesion coefficient and adsorption amount of gases on titanium;

DETAILED DESCRIPTION OF THE PREFERRED EMBODIMENT

Preferred embodiments will be presented in the following with reference to FIGS. 1–6. The present invention relates to protecting the surfaces of in-process wafers when they are being transferred from one unit process to another unit process by covering an as-processed or to-be-processed surface with an ice coating so as to prevent contact between the surface and the environment. The method will be discussed in terms of basic approaches for forming an ice coating on a substrate surface as follows.

(1) The surface may be covered with a thin film of water, and the substrate is then cooled to form an ice film.

(2) The substrate is enveloped in a water vapor, and the entire system including the substrate is cooled to freeze the water condensed on the substrate surface to obtain an ice film.

Figure 1A:
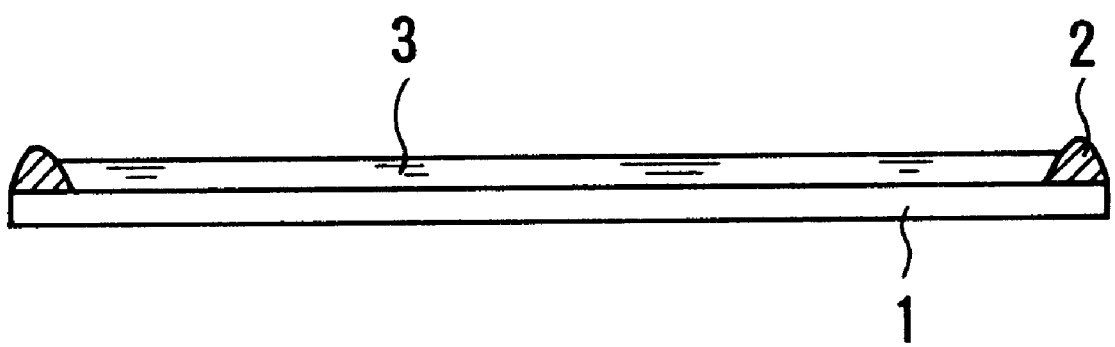
FIGS. 1A and 1B are illustrations of the steps of providing an ice coating on a surface to be protected.
Figure 1B:
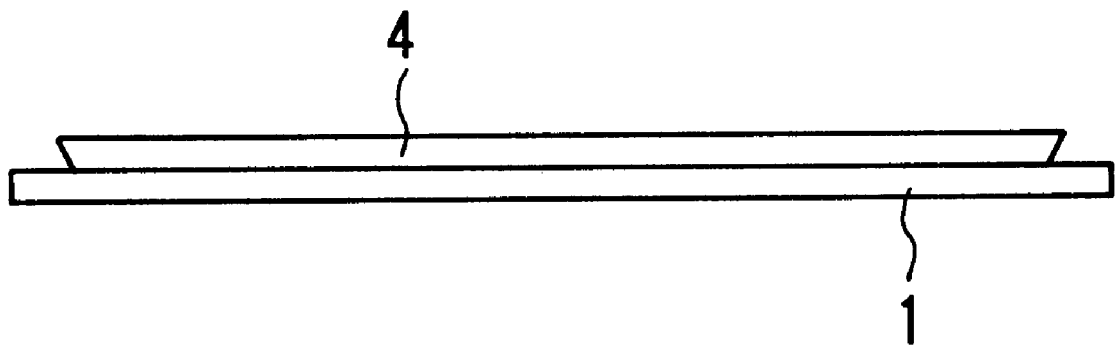
Figure 2:
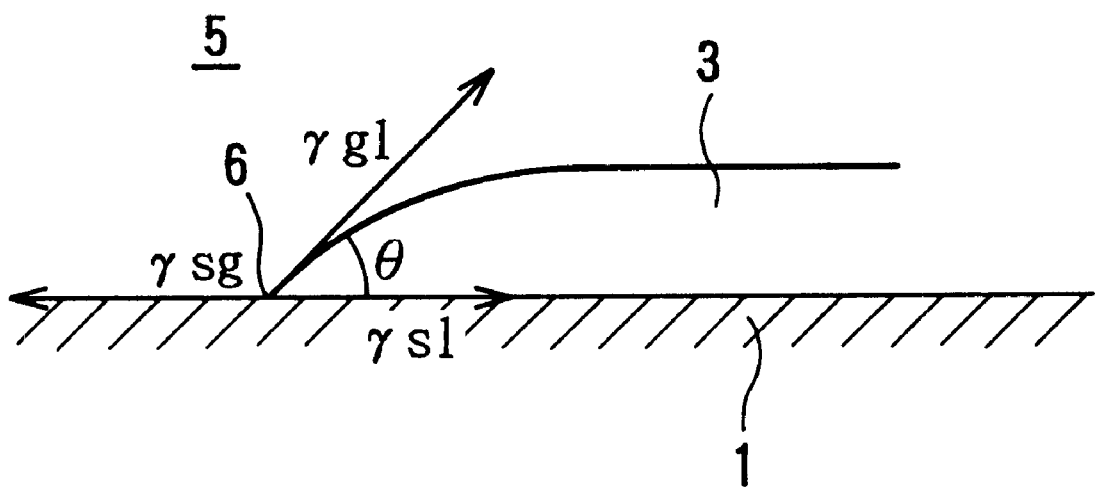
FIG. 2 is an illustration of static equilibrium of surface tension forces acting on water, a substrate and a surrounding atmosphere.

First, an application of approach (1) is explained with reference to FIGS. 1A, 1B and 2. A dike 2, made of a material impervious to water, is constructed around the periphery of a substrate 1, and the inside space is filled with water to form a thin water layer 3 as shown in FIG. 1A. The substrate 1 is then cooled to freeze the water layer 3 to produce an ice film 4 as shown in FIG. 1B. While the water layer 3 is being held within the dike formed on the substrate 1, prior to the freezing operation, the circumferential profile 6 of the water layer 3 is formed as a result of a static equilibrium of surface tension forces acting on the water layer 3 (liquid phase), the substrate 1 (solid phase) and the atmosphere 5 (gas phase), represented by $\gamma_{sl}$, $\gamma_{sg}$, and $\gamma_{gl}$, respectively, then, the following relation can be established.

$$\gamma_{sg} = \gamma_{sf} + \gamma_{fg} \cos \theta \quad (1)$$

where θ is a contact angle, and the shape of the water layer 3 is determined by the weight and the density of water in addition to the condition dictated by Equation (1). Therefore, it is obvious that the thickness of the water layer 3 is determined by the nature of the material of the substrate 1 and the surface condition, and it is difficult to reduce the thickness below a certain limit. For example, when a water film is formed on a clean surface of a silicon wafer of 200 mm diameter, the minimum critical thickness is measured to be about 1.9 mm.

The material for making the dike 2 in practice should be of a type that can be readily peeled off, such as resins used for making photo-resist or silicone resin.

Figure 3:
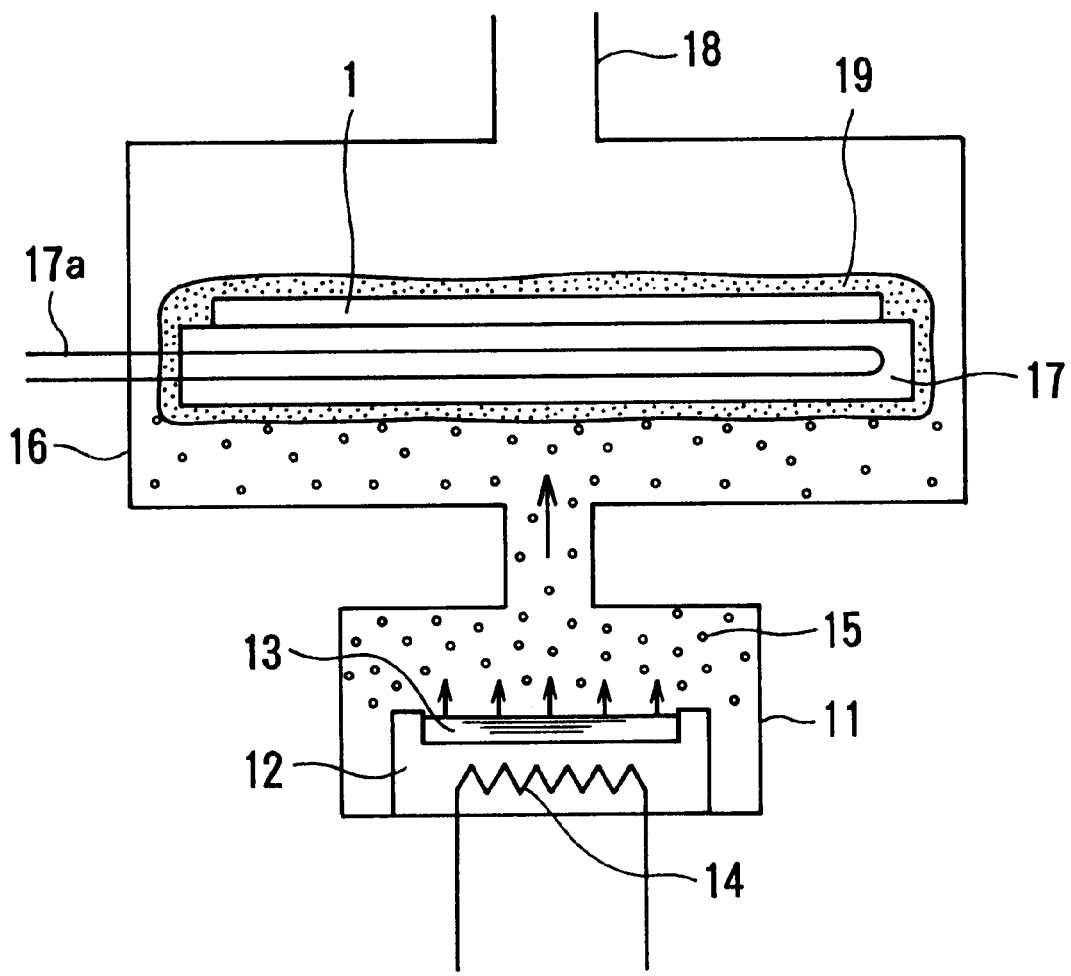
FIG. 3 is a schematic diagram of an apparatus to form an ice coating on a substrate surface.

An application of the concept (2) for making an ice film is shown in FIG. 3. A source of water 13 for obtaining water vapor is stored in a water tank 12 disposed in the interior of a vaporization chamber 11, and a water vapor 15 is produced by vaporizing the source water 13 at a given temperature by a heater 14 submerged in the water 13.

FIG. 3 shows that a cooling chamber 16 is disposed adjacent to the vaporization chamber 11, and the substrate 1 is placed on a cooling plate 17 disposed inside the cooling chamber 16. The cooling plate 17 has an internal cooling pipe 17a which passes a coolant at about −130° C. so that the substrate 1 can be quickly cooled as soon as the substrate 1 is placed on the cooling plate 17. The cooling chamber 16 is provided with an evacuation pipe 18 connected to a vacuum pump so that the pressure in the entire system including the vaporization chamber 11 can be quickly reduced to rapidly supply water vapor by promoting vaporization of the source water 13.

It is known generally that the rate of sticking of gaseous molecules hitting a surface of a solid object increases as the temperature of the solid object is lowered. FIG. 4 (refer to D. J. Harra, J.V.S.T., January/February, 1976) shows a table to compare the adhesion coefficients and the amount of gases that can adhere to a titanium specimen surface held at room temperature (27° C.) and at −195° C. As shown in this table, the adhesion coefficient and the density of molecular adsorption for $CO_2$ and $O_2$ increase as the temperature is lowered. In FIG. 4, a result is lacking for water adsorption at the lower temperature, but according to "Anelva News", No. 62 p8, adhesion coefficient of water at −195° C. is reported to be about 1. Therefore, the adhesion coefficient increases generally at low temperatures so that, when the substrate 1 is cooled sufficiently, water adsorption occurs actively on the substrate 1 and freezes instantly to form an ice film 19 quickly on the substrate 1.

Incidentally, cryogenic trapping of gaseous molecules are widely practiced in parts of vacuum systems in such applications as cryopump.

In the apparatus shown in FIG. 3, it is sometimes effective to provide a special purpose low-power heater (not shown) inside the cooling plate 17 to facilitate release of substrate 1 from the cooling plate 17 after completion of the cooling process.

Also, as mentioned above, the cooling chamber 16 is provided with an evacuation pipe 18 connected to a vacuum pump so that the entire system including the vaporization chamber 11 can be evacuated to promote a rapid formation of water vapor. This is based on the fact that, in systems that release a vapor from a liquid constituent, vaporization rate per unit surface area is increased as the partial pressure of the vapor of the liquid is reduced. This relationship can be expressed quantitatively by the following relation.

$$dN/dt = \{a/(2\pi mkT)^{1/2}\}(Pe-P) \quad (2)$$

where dN is a number of vapor molecules vaporizing from a unit surface of a liquid in a time interval dt, m is a molecular weight, a is the vaporization coefficient and k is the Boltzmann constant.

As evident in Equation (2), as the partial vapor pressure P is reduced, dN/dt increases so that by reducing the partial pressure of water by evacuating the entire system shown in FIG. 3, the supply of water vapor to the substrate 1 can be significantly increased.

The range of application of the present invention is quite wide. An example of application of the present invention will be presented in the following.

Figure 5:
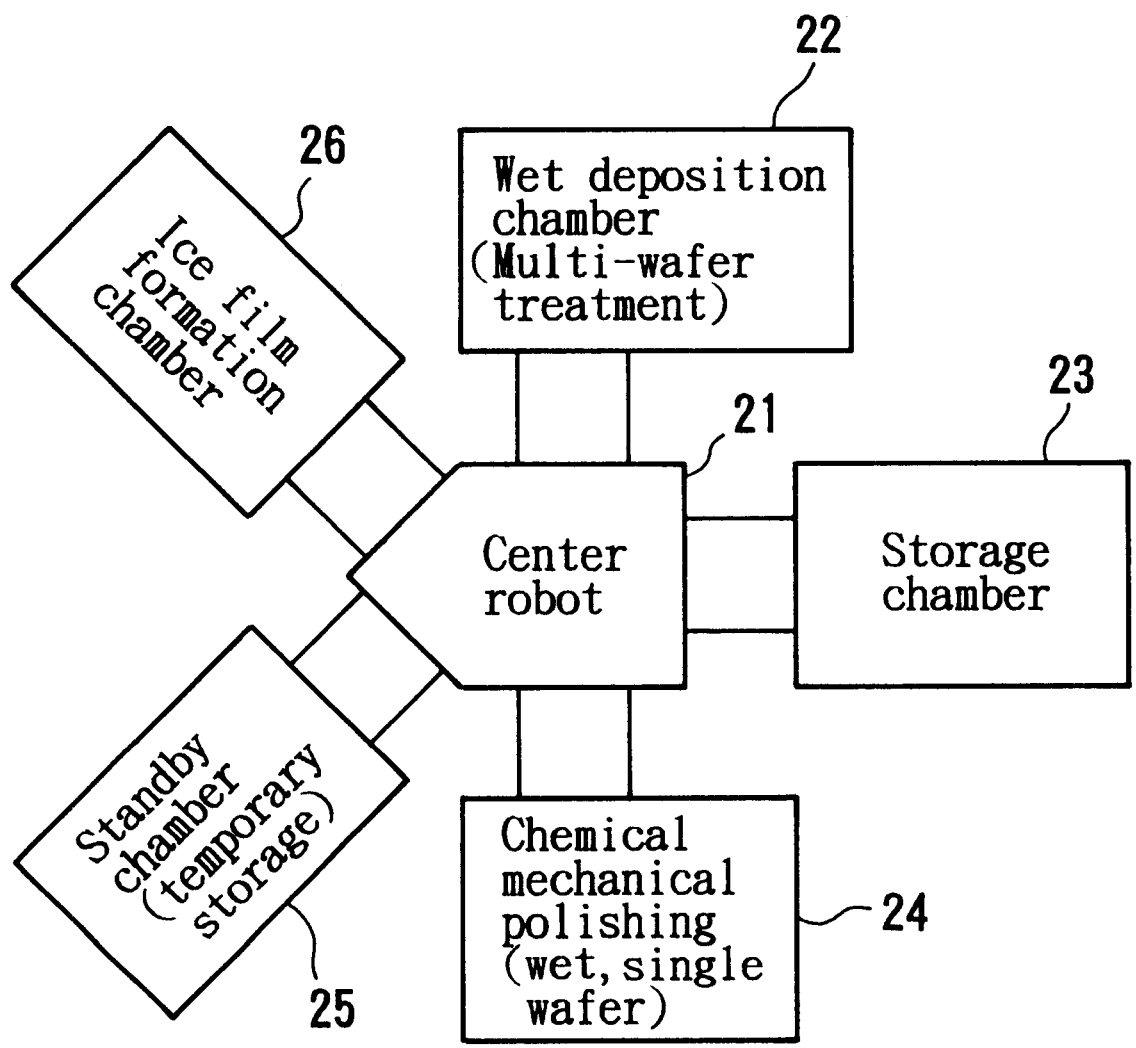
FIG. 5 is a block diagram of an example of applying the surface protection apparatus to a processing facility for semiconductor wafers.

FIG. 5 shows a schematic diagram of a substrate surface protection apparatus applied to a facility that includes lines for processing semiconductor wafers by wet-process film forming and wet polishing processes. As shown in FIG. 5, a central robot 21 is surrounded by a wet-process film forming chamber 22 for forming films on a plurality of substrates at a time; a storage chamber 23 for storing a plurality of substrates; a wet-process polishing chamber 24 for processing one wafer at a time; a standby chamber 25 for holding the substrates temporarily and an ice film coating chamber 26 for forming an ice film on the substrates, which ice film coating chamber is the surface protection apparatus according to the present invention.

To preserve the surface condition of the wafer after wet processing in the wet-process film forming chamber 22 or the desired surface condition after polishing in the wet-process polishing chamber 24, the processed wafer is treated in the ice forming chamber 26 to be coated with an ice film. This treatment provides a protection of a processed surface by preventing the as-processed surface from being exposed to the ambient atmosphere, which exposure could result in degradation and contamination of the surface, whereby the prevention preserves the conditions of the processed surface that has undergone a given process and has reached a certain desired surface condition.

The material for protecting the surface should be chosen so that the coating prevents contact with the process room atmosphere but the coating also should not chemically react with the substrate material and is harmless mechanically, and permits easy melting and removal. From such viewpoints, water fulfills all the requirements, and immersion in warmer water removes the ice film instantly so that water is an ideal material.

Figure 6:
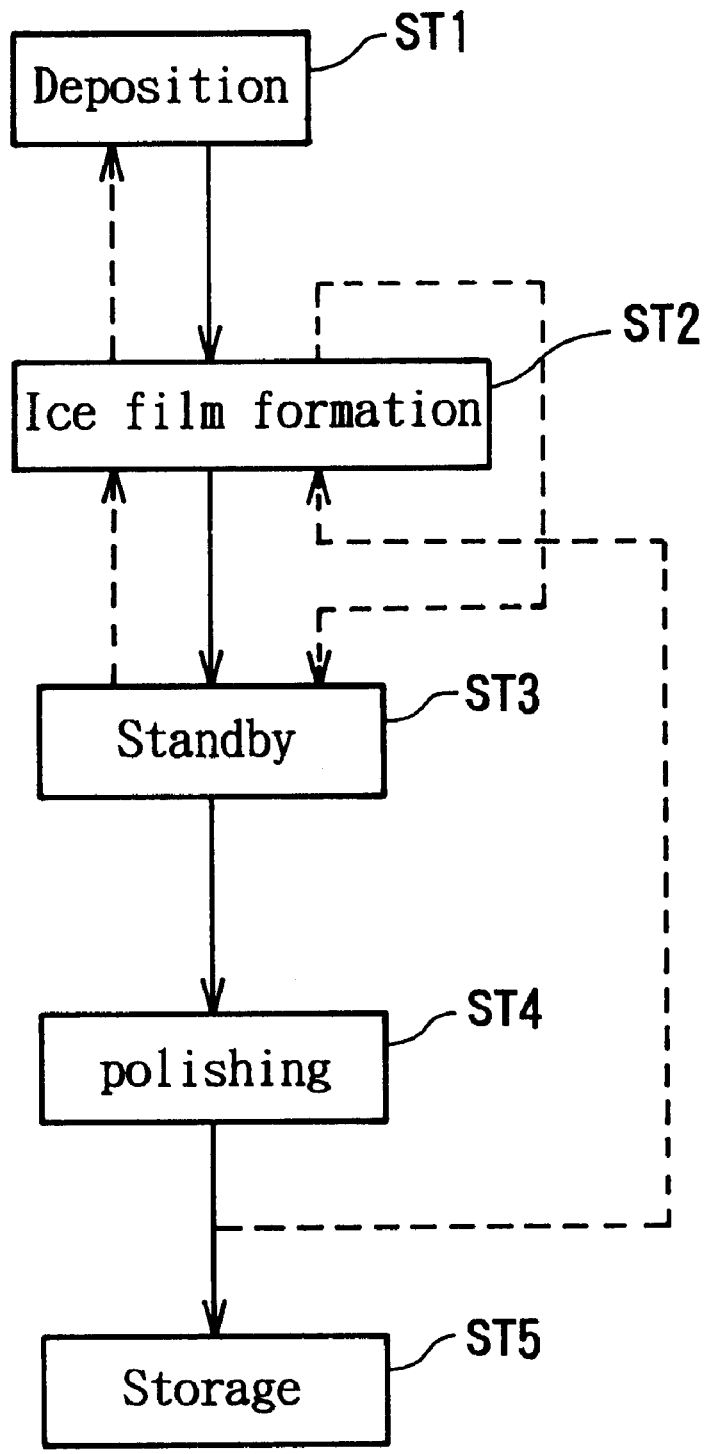
FIG. 6 is a simplified flowchart for a processing line to provide a protective film and perform substrate polishing.

The flowchart shown in FIG. 6 is an example of using the facility in FIG. 5. A plurality of substrates may be treated concurrently in the wet-process film forming chamber 22 (step 1), followed by processing in the ice film coating chamber 26 to envelop the substrates with ice film (step 2), and the ice-coated wafers are placed in standby for temporary storage (step 3). In the wet-process polishing chamber, one wafer at a time is polished (step 4), and the polished wafer is stored in the storage chamber 23 (step 5). In some cases, depending on the manufacturing process of the device, the stored wafers in step 3 may be sent back to the ice film coating chamber 26 to be coated with ice film, followed by further treatments in the wet-process film forming chamber 22. Also, the wafers after polishing in step 4 may be sent to the ice film coating chamber 26 to be coated with ice, and may be stored temporarily in the standby room 25.

The wafers are often required to spend some time waiting for the next unit processing because of the differences in processing factors, such as the processing times of film forming and polishing processes, number of wafers that can be treated at a time, and process productivity. Because the processing is carried out in a process room environment, the conventional standby approach increases the length of time for the wafers to be exposed to the surrounding atmosphere. However, using the process shown in FIG. 6, the surfaces can be protected by ice coating, when necessary, so that potential problems of surface degradation and contamination caused by contact with the surrounding atmosphere are significantly reduced.

It should also be noted that the approach (1) described above is susceptible to high energy consumption and long processing times, because of the natural tendency to form a thick water layer dictated by natural requirements. The advantage is that the apparatus can be relatively simple. On the other hand, although the approach (2) requires a complex apparatus, the advantages are that the film thickness is thin and the processing time is very short. Therefore, the two approaches should be used alternatively to suit the processing requirements so that the surface protection can be practiced to suit the needs of the main processing procedure.

The quality of water used in the present invention should be chosen to be compatible with the use and nature of the substrate material. Especially, for use in protecting semiconductor devices, ultrapure water would generally be chosen. Also, the present method is most suitable to wet-process film forming and polishing processes carried out under normal processing environments, rather than for vacuum processes.

What is claimed is:

1. An apparatus for processing a substrate, comprising:
   a device for producing water vapor in a vaporizing chamber;
   a coating chamber including a device for freezing the water vapor to produce an ice film on at least a part of a surface of a substrate;
   a transferring apparatus for transferring the substrate having the ice film thereon; and
   a wet-process chamber for conducting a wet processing operation on the substrate;
   wherein said wet-process chamber and said coating chamber are disposed around said transferring apparatus, and
   wherein said device for freezing comprises a cooling plate.

2. The apparatus according to claim 1, wherein said coating chamber further includes a heater to release the substrate from said cooling plate.

3. An apparatus for processing a substrate, comprising:
   a device for producing water vapor in a vaporizing chamber;
   a coating chamber including a device for freezing the water vapor to produce an ice film on at least a part of a surface of a substrate;
   a transferring apparatus for transferring the substrate having the ice film thereon; and
   a wet-process chamber for conducting a wet processing operation on the substrate;
   wherein said wet-process chamber and said coating chamber are disposed around said transferring apparatus,
   wherein said device for producing water vapor is in fluid communication with said coating chamber by being positioned within a chamber which is interconnected with said coating chamber via a duct, and
   wherein said device for freezing comprises a cooling plate.

4. The apparatus according to claim 3, wherein said coating chamber further includes a heater to release the substrate from said cooling plate.

* * * * *